United States Patent
Buchhold

(10) Patent No.: US 7,112,955 B2
(45) Date of Patent: Sep. 26, 2006

(54) MAGNETIC SENSING DEVICE INCLUDING A MAGNETORESISTIVE SENSOR AND A SUPPORTING MAGNET

(75) Inventor: Reinhard Buchhold, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 199 days.

(21) Appl. No.: 10/487,206

(22) PCT Filed: Aug. 22, 2002

(86) PCT No.: PCT/IB02/03445

§ 371 (c)(1),
(2), (4) Date: Feb. 18, 2004

(87) PCT Pub. No.: WO03/019217
PCT Pub. Date: Mar. 6, 2003

(65) Prior Publication Data
US 2004/0201377 A1    Oct. 14, 2004

(30) Foreign Application Priority Data
Aug. 23, 2001   (DE) ................. 101 41 371

(51) Int. Cl.
*G01B 7/14*   (2006.01)
*G01B 7/30*   (2006.01)

(52) U.S. Cl. .............. 324/207.21; 324/207.24; 324/207.25; 324/207.26

(58) Field of Classification Search ..............
324/207.2–207.25, 173, 174, 252; 338/32 R, 338/32 H
See application file for complete search history.

(56) References Cited

U.S. PATENT DOCUMENTS

| | | | | |
|---|---|---|---|---|
| 4,712,064 A | * | 12/1987 | Eckardt et al. | 324/207.21 |
| 4,935,698 A | * | 6/1990 | Kawaji et al. | 324/207.2 |
| 5,210,489 A | * | 5/1993 | Petersen | 324/207.12 |
| 5,327,077 A | * | 7/1994 | Honda | 324/207.21 |
| 5,450,009 A | * | 9/1995 | Murakami | 324/207.21 |
| 5,585,719 A | * | 12/1996 | Endo et al. | 324/235 |
| 5,637,995 A | * | 6/1997 | Izawa et al. | 324/174 |
| 5,781,005 A | * | 7/1998 | Vig et al. | 324/207.2 |
| 6,014,023 A | * | 1/2000 | Yokotani et al. | 324/207.21 |
| 6,043,646 A | * | 3/2000 | Jansseune | 324/207.26 |
| 6,107,793 A | * | 8/2000 | Yokotani et al. | 324/207.21 |

FOREIGN PATENT DOCUMENTS

DE    19941860    * 3/2001

* cited by examiner

*Primary Examiner*—Jay M. Patidar
(74) *Attorney, Agent, or Firm*—Aaron Waxler; Paul Im

(57) ABSTRACT

A magnetoresitive sensor comprising at least one sensor element for measuring a magnetic field, and a magnet assigned to the sensor element is disclosed. The magnet (14) has structures (18) which lead to a perpendicular guidance of magnetic flux lines (25) from the supporting magnet (14) in the sensing direction (y direction) at least in the sensitive area (26) of the sensor (100). The inventive sensor has a simple structure and does not require subsequent trimming for compensating an offset as in the prior art.

12 Claims, 3 Drawing Sheets

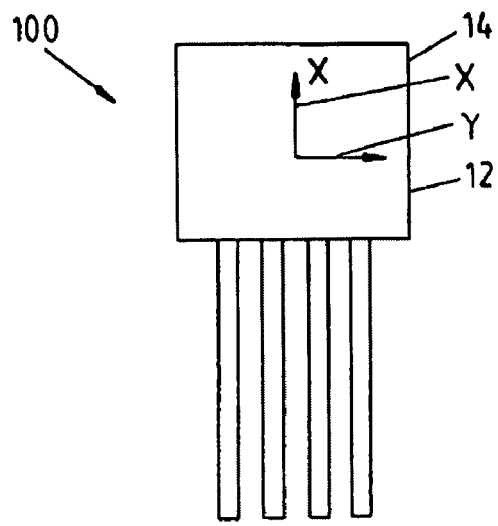
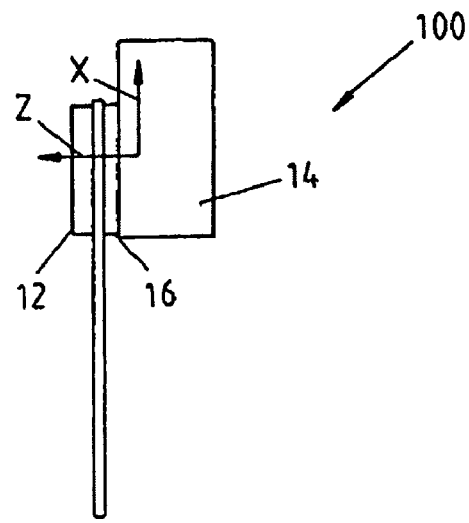
FIG.1     FIG.2
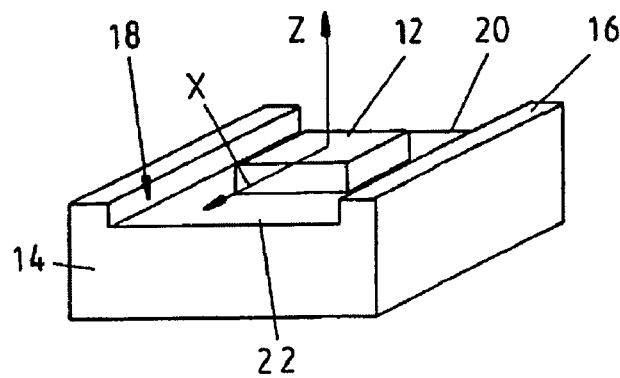
FIG.3
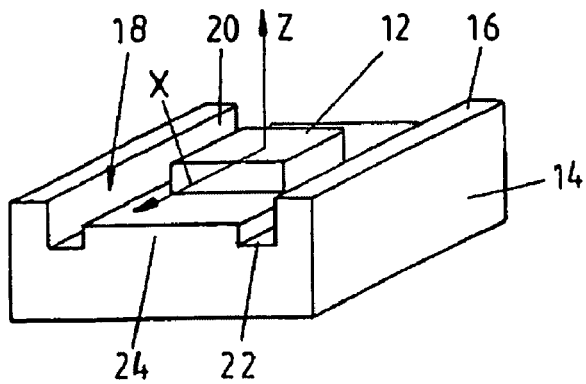
FIG.4

MAGNETIC SENSING DEVICE INCLUDING A MAGNETORESISTIVE SENSOR AND A SUPPORTING MAGNET

FIELD OF THE INVENTION

The invention relates to a magnetoresistive sensor comprising at least one sensor element for measuring a magnetic field, and a supporting magnet assigned to the sensor element.

BACKGROUND OF THE INVENTION

It is known to use magnetoresistive sensors as proximity sensors, motion sensors or position sensors. In the sensors, an external magnetic field is utilized, which produces a proportional voltage signal of the sensor element when the position of the object to be detected changes relative to the source of the external magnetic field. Such magnetoresistive sensors are used, for example, for detecting reference marks in crankshaft angle measurements.

The sensor elements measuring the magnetic field do not usually operate in their saturation range and are based on the principle of the anisotropic magnetoresistive effect. It is therefore known to superimpose on these sensor elements a magnetic field stabilizing the transfer characteristic, which magnetic field is usually produced by a supporting magnet assigned to the sensor element. In the case of passive, ferromagnetic objects to be detected, the magnet is further used for the purpose of providing an operating field whose change is detected under the influence of the object. The magnet and the sensor element are then in a defined fixed position relative to each other. It is known that already slight positioning tolerances between the sensor element and the magnet in the sensitive direction lead to an offset of the characteristic curve of the sensor element. This characteristic curve offset must be compensated by subsequent trimming of the magnetoresistive sensor.

OBJECT AND SUMMARY OF THE INVENTION

It is therefore an object of the invention to provide a magnetoresistive sensor which has a simple structure and does not require subsequent trimming for offset compensation.

According to the invention, this object is solved by a magnetoresistive sensor having at least one sensor element for measuring a magnetic field and a magnet coupled to the sensor element. Since the magnet has structures, preferably on its surface assigned to the least one sensor element, which structures lead to a perpendicular guidance of magnetic flux lines in the sensitive range, it is advantageously achieved that only minimal magnetic fields, which might lead to an offset of the characteristic curve of the sensor element, occur in the positioning plane between the sensor element and the magnet in the sensitive direction. When the supporting magnet according to the invention is used, subsequent trimming of the magnetoresistive sensor is thus not necessary.

In a preferred embodiment of the invention, the structures are formed in such a way that a perpendicular guidance of the magnetic flux lines of the magnet with respect to the positioning plane is maintained in the sensor area. As a result, minimal magnetic fields in the sensitive direction of the positioning plane can be achieved in an optimal manner.

In a preferred embodiment of the invention, the surface structures are constituted by trough-shaped indentations of the magnet, in which the at least one sensor element is arranged. In accordance with preferred embodiments, the trough-shaped indentations are constituted by plane surfaces or concave surfaces with respect to the positioning plane. It is achieved in a simple manner by such an embodiment that magnetic fields in the positioning plane can be optimally minimized in the positioning area of the sensor elements.

In addition to the fact that magnetic trimming of the magnetoresistive sensor can be dispensed with, anisotropic magnetic materials may be used for the magnets in the embodiments according to the invention. These materials are distinguished by their high magnetic long-time stability. Finally, the measuring accuracy of the magnetoresistive sensor is enhanced because of the absence of trimming and thereby a possible trimming error.

BRIEF DESCRIPTION OF THE DRAWINGS

These and other aspects of the invention are apparent from and will be elucidated with reference to the embodiments described hereinafter.

In the drawings:

FIGS. 1 and 2 show a magnetoresistive sensor in a diagrammatic plan view and side elevation;

FIGS. 3 to 6 are different diagrammatic perspective views of sensors according to the invention.

DESCRIPTION OF EMBODIMENTS

Figure 5:
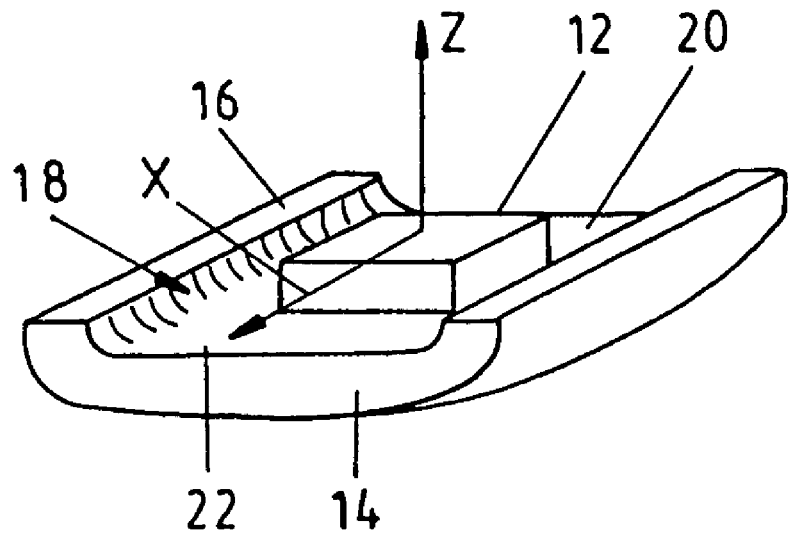

FIGS. 1 and 2 show a magnetoresistive sensor 100. The sensor 100 comprises at least a sensor element 12 which is assigned to a magnet 14. Sensor element 12 and magnet 14 are flexibly connected together in an appropriate manner, for example, glued to each other. A sensor element 12 is herein understood to mean a sensor chip which may comprise a plurality of magnetoresistive ranges (resistances) in a bridge circuit configuration. Furthermore, the sensor chip may comprise integrated electronic components for evaluating the sensor signals.

For the purpose of clarity, a system of co-ordinates is incorporated in the Figures. It can be seen from FIGS. 1 and 2 that an x/y plane extends parallel to a surface 16 of the magnet 14. The surface 16 simultaneously constitutes the positioning plane for the sensor element 12 on the supporting magnet 14. An x/z plane subtends perpendicularly to the surface 16, in which the magnetization vector of the magnet is situated. An y/z plane also subtends perpendicularly to the surface 16, but is 90° rotated with respect to the x/z plane.

The sensitive direction of the sensor 100 is the y direction. This means that, in the case of an approach to an external magnetic field, for example, by a reference magnet during measurement of a crankshaft angle, this magnet is moved in the y direction past the sensor 100. The approach and the instantaneous position of the reference magnet and thus, for example, the position of the crankshaft can thereby be detected.

FIGS. 3 to 6 show four different variants of the magnet 14. As is shown in these Figures, the surface 16 has structures 18 which are essentially constituted by trough-shaped indentations 20. In accordance with the embodiment shown in FIG. 3, the trough-shaped indentation 20 has a plane bottom surface 22 on which the sensor element 12 is arranged. In accordance with the embodiment shown in FIG. 4, the surface 22 is provided with a pedestal-like elevation 24 on which the sensor element 12 is arranged.

Figure 6:
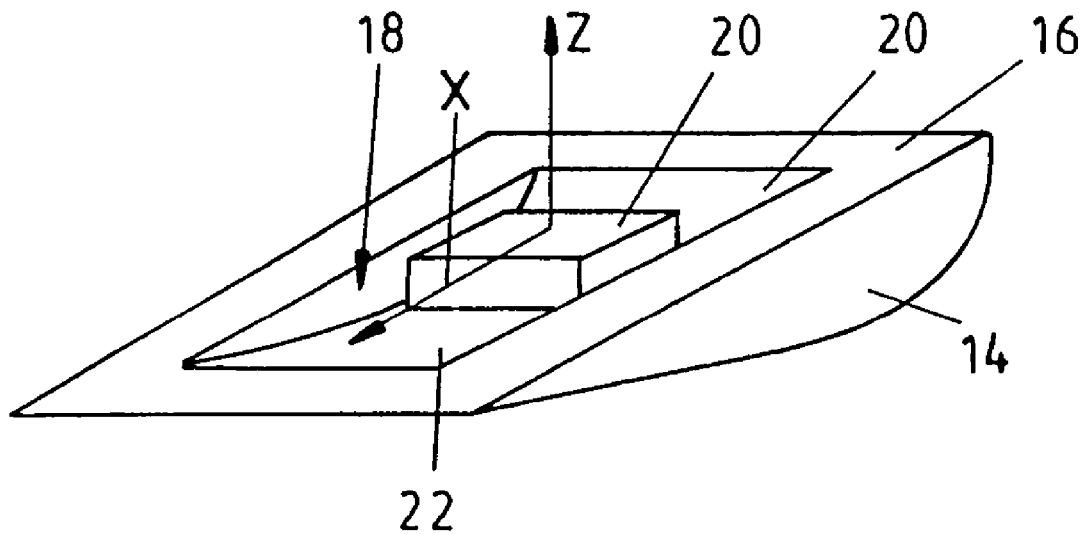

FIG. 5 shows a variant in which the magnet 14 has a convex symmetrical shape with respect to the sensor element 12, while the surface 22 is convex in the y direction. In the area of the sensor chip 12, the surface 22 is, however, plane. An analog variant is shown in FIG. 6 in which the surface 22 is convex in the x direction. Furthermore, the supporting magnet 14 is wedge-shaped in the x direction.

Embodiments other than the ones shown in the Figures are possible within the scope of the invention. Differently chosen structures of the magnets 14 are of course also feasible when it is thereby achieved that the magnetic flux lines 25 of the magnet 14 perpendicularly to the surface 16, i.e. perpendicularly to the x/y plane, emerge from the magnet 14 in the area of the sensor element 12.

Figure 7:
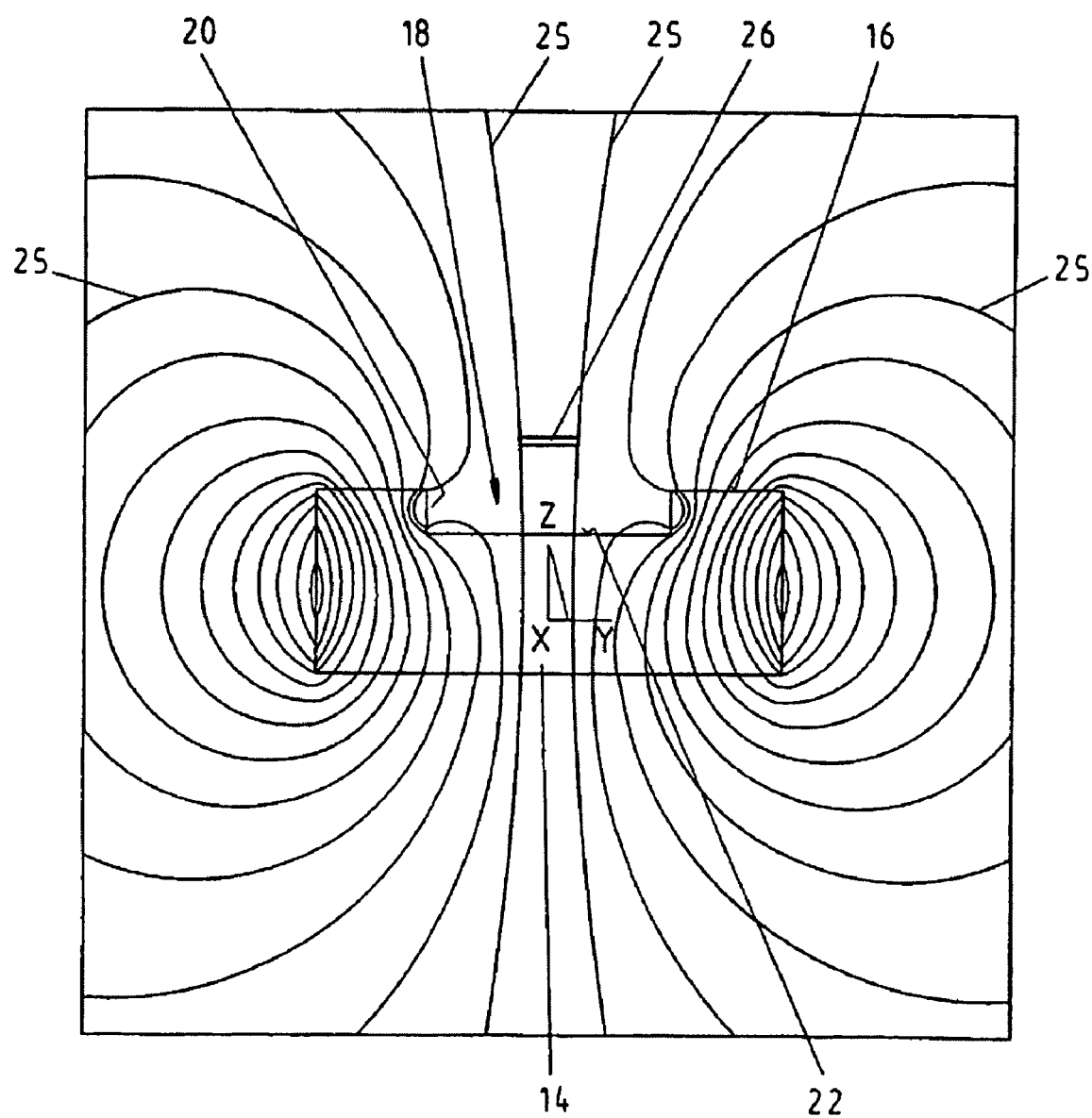
FIG. 7 shows a magnetic field distribution of the supporting magnet according to the invention, shown in FIG. 3.

This is shown by way of example in FIG. 7 with reference to the magnet 14 shown in FIG. 3. The Figure is a sectional view of the magnet 14 with the indentation 20 constituting the structure 18. In this representation, the plane of the drawing coincides with the y/z plane. It is clear from the Figure that the indentation 20 deflects the magnetic flux lines 25 outside the magnet 14 in such a way that the magnetic flux lines 25 emerge essentially perpendicularly to the surface 16 without any deflection in the y direction in the sensitive area 26, i.e. in the area in which the sensor element 12 is arranged. This leads to only a minimal magnetic field $H_y$ in the sensitive area 26. This quasi-unavailable magnetic field $H_y$ can therefore not lead to an offset of the sensor element 12 in its sensing direction, i.e. in the y direction.

The invention claimed is:

1. A magnetoresistive sensor comprising at least one sensor element for measuring a magnetic field, and a magnet coupled to the sensor element, wherein the magnet comprises a first side and a second side, the first side comprising a surface and at least one structure which leads to a perpendicular guidance of magnetic flux lines from the magnet in a sensing direction (y direction) at least in a sensitive area of the sensor.

2. A magnetoresistive sensor as claimed in claim 1, wherein the at least one structure is formed in the surface, and wherein the surface faces the least one sensor element.

3. A magnetoresistive sensor as claimed in claim 1, wherein the magnetic flux lines are guided perpendicularly with respect to the surface in the sensitive area.

4. A magnetoresistive sensor as claimed in claim 1, wherein the surface comprises a trough-shaped indentation in which the senor element is arranged.

5. A magnetoresistive sensor as claimed in claim 1, wherein the structure is a trough-shaped indentation having a plane bottom surface.

6. A magnetoresistive sensor as claimed in claim 1, wherein the structure comprises a plane bottom surface, the plane bottom surface comprising a pedestal-like elevation for accommodating the sensor element.

7. A magnetoresistive sensor as claimed in claim 1, wherein the structure is a trough-shaped indentation having a concave shape.

8. A magnetoresistive sensor as claimed in claim 7, wherein the concave shape extends in the y direction.

9. A magnetoresistive sensor as claimed in claim 7, wherein the concave shape extends in the x direction.

10. A magnetoresistive sensor as claimed in claim 1, wherein the magnet is concave-shaped.

11. A magnetoresistive sensor as claimed in claim 1, wherein the magnet is wedge-shaped.

12. A magnetoresistive sensor comprising at least one sensor element for measuring a magnetic field, and a magnet coupled to the sensor element, wherein the magnet comprises a first side and a second side, the first side comprising a surface defined by a plane lying on the first side and the first side further comprising at least one structure which leads to a perpendicular guidance of magnetic flux lines from the magnet in a sensing direction (y direction) at least in a sensitive area of the sensor, wherein the structure is formed by an indentation in the surface, the indentation comprising at least one structure surface, the structure surface being below the plane, and wherein the magnet and the sensor are coupled at the structure surface.

* * * * *